US012174231B2

(12) United States Patent
Katsuyama et al.

(10) Patent No.: US 12,174,231 B2
(45) Date of Patent: Dec. 24, 2024

(54) MEASUREMENT DEVICE AND MEASUREMENT METHOD

(71) Applicants: Yokogawa Electric Corporation, Musashino (JP); Hosei University, Tokyo (JP)

(72) Inventors: Jun Katsuyama, Tokyo (JP); Yoshinori Matsumoto, Tokyo (JP); Mitsuru Shinagawa, Tokyo (JP)

(73) Assignees: Yokogawa Electric Corporation, Musashino (JP); Hosei University, Tokyo (JP)

( * ) Notice: Subject to any disclaimer, the term of this patent is extended or adjusted under 35 U.S.C. 154(b) by 740 days.

(21) Appl. No.: 17/275,743

(22) PCT Filed: Sep. 19, 2019

(86) PCT No.: PCT/JP2019/036732
§ 371 (c)(1),
(2) Date: Mar. 12, 2021

(87) PCT Pub. No.: WO2020/066828
PCT Pub. Date: Apr. 2, 2020

(65) Prior Publication Data
US 2022/0034951 A1 Feb. 3, 2022

(30) Foreign Application Priority Data
Sep. 26, 2018 (JP) .................. 2018-180874

(51) Int. Cl.
*G01R 27/26* (2006.01)
*G01B 21/08* (2006.01)
*G01R 29/08* (2006.01)

(52) U.S. Cl.
CPC ......... *G01R 27/2623* (2013.01); *G01B 21/08* (2013.01); *G01R 29/08* (2013.01)

(58) Field of Classification Search
CPC .... G01B 21/08; G01R 27/2623; G01R 29/08; G01R 1/00; G01R 3/00; G01R 5/00;
(Continued)

(56) References Cited

U.S. PATENT DOCUMENTS 6,496,018 B1 * 12/2002 Nagata .................. G01N 22/00
324/636
7,742,835 B2 * 6/2010 Sasaki ..................... B29C 48/08
700/128
(Continued)

FOREIGN PATENT DOCUMENTS

JP 3204852 B2 * 9/2001
JP 5295047 B2 9/2013

OTHER PUBLICATIONS

Ryo Saito, "Calibration Technology of Organic Photovoltaic Cell Voltage Using Electrooptic Probe", Bulletin of Graduate School of Science, Engineering and Engineering, Hosei University, 2017, vol. 58, 5 pages.

*Primary Examiner* — Feba Pothen
*Assistant Examiner* — Brent J Andrews
(74) *Attorney, Agent, or Firm* — Sughrue Mion, PLLC (57) ABSTRACT

A measurement device includes an electric field generator, an electric field detector, a thickness gauge, and a processor. The electric field generator generates an alternating current electric field. The electric field detector detects the alternating current electric field generated by the electric field generator. The thickness gauge measures a thickness of a measurement target in a non-contact manner. The processor derives a calibration curve representing a relationship between a specific dielectric constant and an intensity of an alternating current electric field. The measurement target is insertable between the electric field generator and the electric field detector. The electric field detector detects an intensity of the alternating current electric field attenuated
(Continued)

by the measurement target. The processor calculates a specific dielectric constant of the measurement target based on the detected intensity of the alternating current electric field, the measured thickness, and the derived calibration curve.

7 Claims, 6 Drawing Sheets

(58) Field of Classification Search
CPC . G01R 7/00; G01R 9/00; G01R 11/00; G01R 13/00; G01R 15/00; G01R 17/00; G01R 19/00; G01R 21/00; G01R 22/00; G01R 23/00; G01R 25/00; G01R 27/00; G01R 29/00; G01R 31/00; G01R 35/00; G01R 33/00
See application file for complete search history.

(56) References Cited

U.S. PATENT DOCUMENTS

| | | | | |
|---|---|---|---|---|
| 2004/0026633 A1* | 2/2004 | Gunji | ................... | H01J 37/244 |
| | | | | 250/492.1 |
| 2004/0130341 A1* | 7/2004 | Kawanishi | ........... | G01R 31/311 |
| | | | | 324/754.23 |
| 2006/0288782 A1* | 12/2006 | Sawamoto | ........... | G01N 33/346 |
| | | | | 73/579 |

* cited by examiner

MEASUREMENT DEVICE AND MEASUREMENT METHOD

CROSS-REFERENCE TO RELATED APPLICATIONS

This application is a National Stage of International Application No. PCT/JP2019/036732 filed on Sep. 19, 2019, claiming priority based on Japanese Patent Application No. 2018-180874, filed in Japan on Sep. 26, 2018, the entire contents of each of which are incorporated by reference herein in their entireties.

TECHNICAL FIELD

The present invention relates to a measurement device and a measurement method.

BACKGROUND ART

In recent years, dielectric materials have been used in electronic devices. As a method of measuring a dielectric constant of such a dielectric material, an electrostatic capacitance method using an impedance analyzer or an LCR meter or the like in a relatively low frequency band is known. In such measurement, it is possible to observe a macroscopic specific dielectric constant of the entire sample, but it is difficult to obtain information in a microscopic region.

From the viewpoint of improvement in the quality of dielectric materials and defect diagnosis, there is an increasing demand for measuring a significantly small region with high spatial resolution.

Thus, as a method of measuring a specific dielectric constant of a dielectric material with high spatial resolution, a method of measuring a specific dielectric constant of a sample using an LC resonance circuit including a measurement electrode in contact with the surface of a sample, a capacitor unit made of an electrode facing the measurement electrode, and a coil has been proposed (see, for example, Patent Literature 1).

As a method of measuring a specific dielectric constant of a dielectric material with high spatial resolution, a method of measuring a specific dielectric constant of a sample by positioning a probe on the surface of a sample, relatively exciting either the probe or the sample, and measuring a change in electrostatic capacitance has been proposed (see, for example, Patent Literature 2).

There is an increasing demand for measuring specific dielectric constants of dielectric materials with high spatial resolution at a high speed.

CITATION LIST

Patent Literature

[Patent Literature 1]
 Japanese Patent No. 3204852
[Patent Literature 2]
 Japanese Patent No. 5295047

Non-Patent Literature

[Non-Patent Literature 1]
 Ryo Saito, "CALIBRATION TECHNOLOGY OF ORGANIC PHOTOVOLTAIC CELL VOLTAGE USING ELECTROOPTIC PROBE," Hosei University, Graduate School of Science and Engineering, Departmental Bulletin Paper Vol. 58, March 2017

SUMMARY OF INVENTION

Technical Problem

In the technology described in Patent Literature 1, because it is necessary for the measurement electrode to be in contact with a sample, the surface of the sample is likely to be scratched, resulting in destructive inspection. In the technology described in Patent Literature 1, it is difficult to measure a moving object because contact with the sample surface is required. Thus, it is difficult to apply the technology described in Patent Literature 1 to in-line measurement during a process in which a sheet- or film-shaped sample is conveyed and manufactured at a high speed.

In the technology described in Patent Literature 2, although the probe is not brought into contact with the sample, a distance between the probe and the sample surface must be 30 nm or less. Thus, in the technology described in Patent Literature 2, in the process in which the sheet- or film-shaped sample is conveyed and manufactured at a high speed, the sample may flutter in the vertical direction, and the probe is likely to come into contact with the sample. Thus, it is difficult to apply the technology described in Patent Literature 2 to in-line measurement during a process.

An aspect of the present invention provides a measurement device and a measurement method capable of measuring a specific dielectric constant of a sheet- or film-shaped dielectric with high spatial resolution in a non-contact manner.

Solution to Problem

A measurement device according to an aspect of the present invention includes an electric field generator configured to generate an alternating current electric field, an electric field detector disposed to face the electric field generator at a distance from the electric field generator and configured to detect the alternating current electric field generated by the electric field generator, a thickness gauge configured to measure a thickness of a measurement target in a non-contact manner, and a processor configured to derive a calibration curve representing a relationship between a specific dielectric constant and an intensity of an alternating current electric field. The measurement target is insertable between the electric field generator and the electric field detector. The electric field detector is configured to detect an intensity of the alternating current electric field attenuated by the measurement target. The processor is configured to calculate a specific dielectric constant of the measurement target on the basis of the detected intensity of the alternating current electric field, the measured thickness, and the derived calibration curve.

According to the above-described configuration, the measurement device can measure a specific dielectric constant of a sheet- or film-shaped dielectric with high spatial resolution in a non-contact manner because the electric field generator and the electric field detector are disposed at a distance from each other not contact with the measurement target, the thickness gauge is disposed not to contact with the measurement target, and the specific dielectric constant is calculated on the basis of measured values and the calibration curve.

In the measurement device according to the aspect of the present invention, the electric field detector may be an electric field sensor to which an electro-optic effect is applied.

According to the above-described configuration, the measurement device can perform stable measurement with low disturbance as compared with measurement using a metal antenna by using an electro-optic probe for the electric field detector. The measurement device can perform measurement with higher spatial resolution than measurement using the metal antenna by devising measures such as miniaturization of the electro-optic crystal for use in the electro-optic probe and reduction in a beam diameter of reference light. Further, the measurement device sets a frequency of a signal input to the electric field generator to about several kilohertz (kHz) to several megahertz (MHz), so that it is possible to achieve an effect that the device can be cost-effectively constructed as compared with a measurement method using a signal of a millimeter wave band or a microwave band without the need for speeding up the signal detection circuit.

In the measurement device according to the aspect of the present invention, the calibration curve may represent a relationship between the specific dielectric constant of each of a plurality of measurement targets whose specific dielectric constants are known and an intensity of the alternating current electric field. The processor may derive the calibration curve for each thickness of the measurement targets whose specific dielectric constants are known.

According to the above-described configuration, the measurement device can measure a specific dielectric constant with high spatial resolution because the calibration curve is derived using measurement targets whose specific dielectric constants are known.

In the measurement device according to the aspect of the present invention, the processor may obtain slopes and intercepts for each thickness from a plurality of calibration curves for each thickness of the measurement targets whose specific dielectric constants are known and calculate a specific dielectric constant of the measurement target whose specific dielectric constant is unknown using the slopes and the intercepts of the calibration curves associated with the measured thicknesses the detected intensity of the alternating current electric field.

According to the above-described configuration, the measurement device can easily measure a specific dielectric constant with high spatial resolution because the specific dielectric constant of the measurement target whose specific dielectric constant is unknown is calculated on the basis of the calibration curve derived using the measurement targets whose specific dielectric constant are known.

In the measurement device according to the aspect of the present invention, the processor may obtain slopes and intercepts for each thickness from a plurality of calibration curves for each thickness of the measurement targets whose specific dielectric constants are known, obtain a first function having a plurality of slopes as thickness variables, obtain a second function having a plurality of intercepts as thickness variables, obtain a slope and an intercept of a calibration curve associated with the measured thickness using the measured thickness, the first function, and the second function, and calculate a specific dielectric constant of the measurement target whose specific dielectric constant is unknown using the slope and the intercept of the calibration curve associated with the measured thickness and the detected intensity of the alternating current electric field.

According to the above-described configuration, the measurement device can easily measure a specific dielectric constant with high spatial resolution because the specific dielectric constant of the measurement target whose specific dielectric constant is unknown is calculated on the basis of the calibration curve derived using the measurement targets whose specific dielectric constant are known.

In the measurement device according to the aspect of the present invention, the measurement target may be a sheet- or film-shaped dielectric material. A high-voltage signal may be used as an excitation signal of the alternating current electric field generated from the electric field generator and a distance between the electric field generator and the electric field detector may be several millimeters (mm). In a case where the measurement target is conveyed by a conveyance device at a high speed, the electric field generator and the electric field detector may be disposed not to contact with the measurement target even if the measurement target vibrates in a vertical direction.

According to the above-described configuration, the measurement device can set the distance between the electric field generator and the electric field detector to several millimeters (mm) using a low frequency at which a high-voltage signal can be generated as the excitation signal of the alternating current electric field generated from the electric field generator. Thereby, the measurement device can perform total inspection on the measurement targets during manufacturing and contribute to the improvement of productivity because the measurement targets can be conveyed at a high speed in which a gap having a sufficient distance is secured.

The measurement device according to the aspect of the present invention may further include a movement device configured to move the electric field generator, the electric field detector, and the thickness gauge in a horizontal direction orthogonal to a conveying direction of the measurement target. The processor may measure a surface distribution of a specific dielectric constant of the measurement target.

According to the above-described configuration, the measurement device can measure the surface distribution of the specific dielectric constant of the measurement target.

The measurement device according to the aspect of the present invention may further include a storage storing the calibration curves derived by the processor for each thickness of the measurement targets whose specific dielectric constants are known.

According to the above-described configuration, the measurement device can measure a specific dielectric constant with high spatial resolution because the calibration curves are derived using the measurement targets whose specific dielectric constant are known.

In the measurement device according to the aspect of the present invention, the processor may control a start and an end of electric field generation of the electric field generator and a magnitude of the electric field.

According to the above-described configuration, the measurement device can measure a specific dielectric constant of a sheet- or film-shaped dielectric with high spatial resolution in a non-contact manner.

A measurement method according to an aspect of the present invention, using a measurement device including an electric field generator configured to generate an alternating current electric field, an electric field detector disposed to face the electric field generator at a distance from the electric field generator and configured to detect the alternating current electric field generated by the electric field generator, a thickness gauge configured to measure a thickness of a measurement target in a non-contact manner, and a processor configured to derive a calibration curve representing a relationship between a specific dielectric constant and an intensity of an alternating current electric field, wherein the measurement target is insertable between the electric field generator and the electric field detector, the measurement method including deriving, by the processor, the calibration curve for each thickness of a plurality of measurement targets whose specific dielectric constants are known, the calibration curve representing a relationship between the specific dielectric constant of each of the plurality of measurement targets whose specific dielectric constants are known and the intensity of the alternating current electric field, detecting, by the electric field detector, an intensity of the alternating current electric field attenuated by the measurement target whose specific dielectric constant is unknown, measuring, by the thickness gauge, the thickness of the measurement target whose specific dielectric constant is unknown, and calculating, by the processor, a specific dielectric constant of the measurement target whose specific dielectric constant is unknown on the basis of the detected intensity of the alternating current electric field, the measured thickness, and the derived calibration curve.

According to the above-described configuration, the measurement device can measure a specific dielectric constant of a sheet- or film-shaped dielectric with high spatial resolution in a non-contact manner by executing the measurement method.

Advantageous Effects of Invention

According to the aspect of the present invention, it is possible to measure a specific dielectric constant of a sheet- or film-shaped dielectric with high spatial resolution in a non-contact manner.

DESCRIPTION OF EMBODIMENTS

Hereinafter, embodiments of the present invention will be described with reference to the drawings. In the drawings used in the following description, the scale of each member is appropriately changed to make each member recognizable.

Configuration Example of Measurement Device 1

Figure 1:
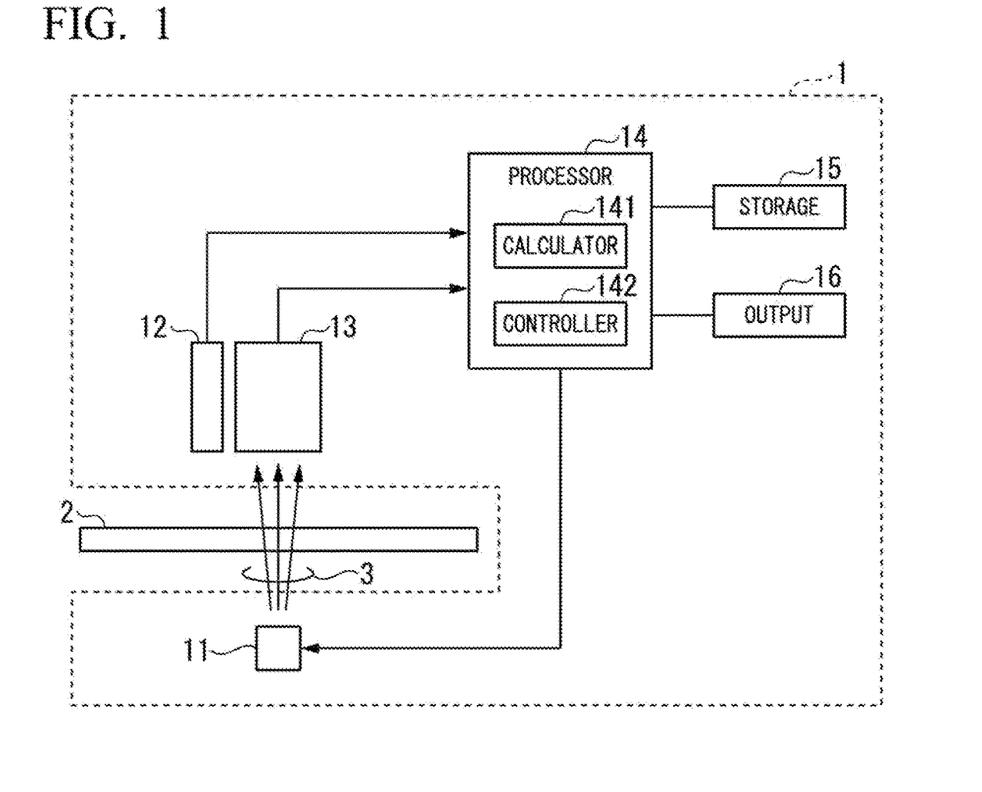
FIG. 1 is a diagram showing an example of a configuration of a measurement device according to the present embodiment.

FIG. 1 is a diagram showing an example of a configuration of a measurement device 1 according to the present embodiment. As shown in FIG. 1, the measurement device 1 includes an electric field generation source 11, a thickness gauge 12, a sensor 13, a processor 14, a storage 15, and an output 16. The processor 14 includes a calculator 141 and a controller 142.

The measurement device 1 measures a thickness and an electric field value of a sample 2 (a measurement target) and obtains a specific dielectric constant of the sample 2 on the basis of measured values.

The sample 2 (the measurement target) is a film- or sheet-shaped dielectric. The sample 2 is inserted between the electric field generation source 11 (an electric field generator) and the sensor 13 (an electric field detector).

The electric field generation source 11 generates an AC electric field 3 in accordance with control of the controller 142 of the processor 14.

The thickness gauge 12 is a sensor that measures a thickness of the sample 2 in, for example, an optical type, an ultrasonic type, or the like. The thickness gauge 12 measures the thickness of the sample 2 in a non-contact manner and outputs a measured value to the calculator 141 of the processor 14. The thickness gauge 12 is disposed so that the thickness gauge 12 is not in contact with the sample 2.

The sensor 13 detects the AC electric field 3 generated by the electric field generation source 11 and outputs an electric field measured value (an intensity of the AC electric field) according to an intensity of a frequency component to the calculator 141. The sensor 13 detects the intensity of the AC electric field 3 attenuated by the sample 2. Thus, first, the sensor 13 detects the intensity of the AC electric field 3 in a state in which the sample 2 is absent. The sensor 13 may be an electric field sensor such as an electro-optic probe (see Non-Patent Literature 1) using an electro-optic crystal having an electro-optic effect. The electric field generation source 11 and the sensor 13 are disposed to face each other.

The electric field generation source 11 and the sensor 13 are disposed at a distance from each other so that the electric field generation source 11 and the sensor 13 as not in contact with the sample 2 (the measurement target). The distance is, for example, several tens of micrometers (μm) to several millimeters (mm).

The calculator 141 obtains the specific dielectric constant of the sample 2 using the detection value output from the thickness gauge 12, the electric field measured value output from the sensor 13, and information stored in the storage 15. The calculator 141 outputs the obtained specific dielectric constant to the output 16. A method of obtaining the specific dielectric constant will be described later.

The controller 142 controls the start and end of the electric field generation of the electric field generation source 11 and a magnitude of the electric field.

The storage 15 stores a relationship (a calibration curve) between the specific dielectric constant and the electric field measured value for each thickness of the sample. The storage 15 stores information indicating a relationship between the thickness of the sample and a slope of a graph representing a relationship between the specific dielectric constant and the electric field measured value. Further, the storage 15 stores information representing a relationship between the thickness of the sample and an intercept of the graph representing the relationship between the specific dielectric constant and the electric field measured value. Further, the storage 15 stores information representing a relationship between the thickness of the sample and the electric field measurement value.

The output 16 is, for example, a display device, a printing device, or the like. The output 16 displays or prints the specific dielectric constant output from the calculator 141.

Example of Calibration Curve

Next, the information stored in the storage 15 will be described.

Figure 2:
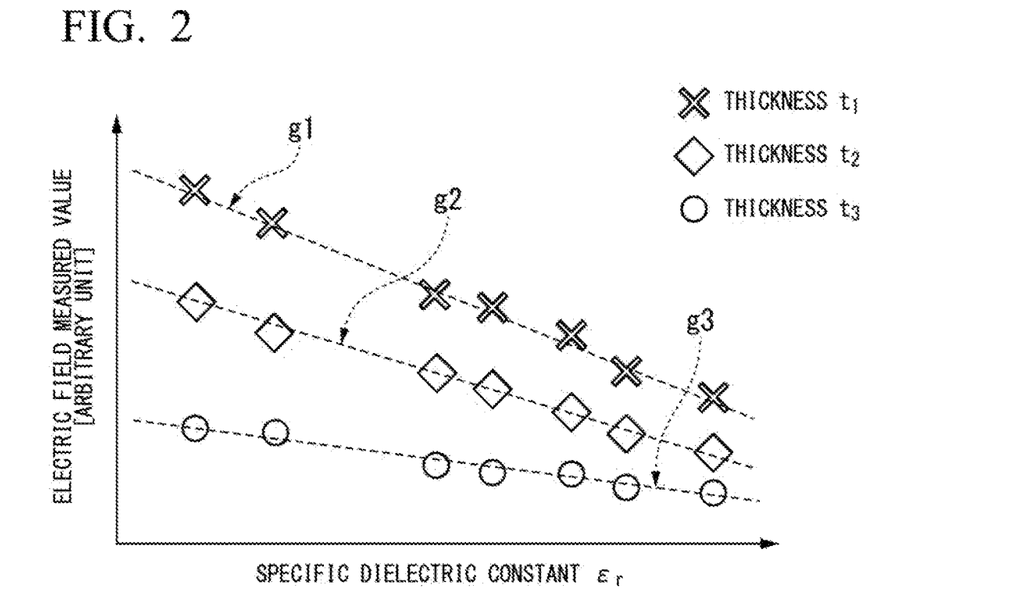
FIG. 2 is a diagram showing an example of a calibration curve between a specific dielectric constant and an electric field measured value according to the present embodiment.

FIG. 2 is a diagram showing an example of a calibration curve between a specific dielectric constant and an electric field measured value according to the present embodiment. In FIG. 2, the horizontal axis represents a specific dielectric constant and the vertical axis represents an electric field measured value (an arbitrary unit). The reference sign g1 represents a relationship between the specific dielectric constant and the electric field measured value when a thickness of a sample is $t_1$. A cross mark represents results of measuring electric field measured values in samples having different specific dielectric constants at the thickness of $t_1$. The reference sign g2 represents a relationship between the specific dielectric constant and the electric field measured value when the thickness of the sample is $t_2$. A diamond mark represents results of measuring electric field measured values in samples having different specific dielectric constants at the thickness of $t_2$. The reference sign g3 represents a relationship between the specific dielectric constant and the electric field measured value when the thickness of the sample is $t_3$. A circle mark represents results of measuring electric field measured values in samples having different specific dielectric constants at the thickness of $t_3$.

The relationship between the specific dielectric constant and the electric field measured value will be further described.

When the specific dielectric constant of the sample located between the sensor 13 and the electric field generation source 11 becomes high, the intensity of the AC electric field 3 detected by the sensor 13 decreases in a proportional relationship because electrical conductivity (corresponding to a dielectric loss in a dielectric) proportional to an imaginary part correlated with a real part of a complex dielectric constant increases and a loss is caused in accordance with a Kramers-Kronig relation equation. Because there is such a relationship between the specific dielectric constant and the electric field measured value, the specific dielectric constant and the electric field measured value are represented by a linear function by performing linear approximation according to regression analysis in the present embodiment.

In FIG. 2, assuming that a slope is $a_n$ and an intercept is $b_n$ (n is a corresponding integer of n in the thickness $t_n$), an electric field measured value V at a thickness $t_1$ is represented by $V=a_1 \times \varepsilon_r + b_1$. An electric field measured value V at a thickness $t_2$ is represented by $V=a_2 \times \varepsilon_r + b_2$. An electric field measured value V at a thickness $t_3$ is represented by $V=a_3 \times \varepsilon_r + b_3$. Each of these linear equations is a calibration curve A.

[Procedure of Deriving Calibration Curve]

Next, a procedure of introducing a calibration curve shown in FIG. 2 will be described.

Figure 3:
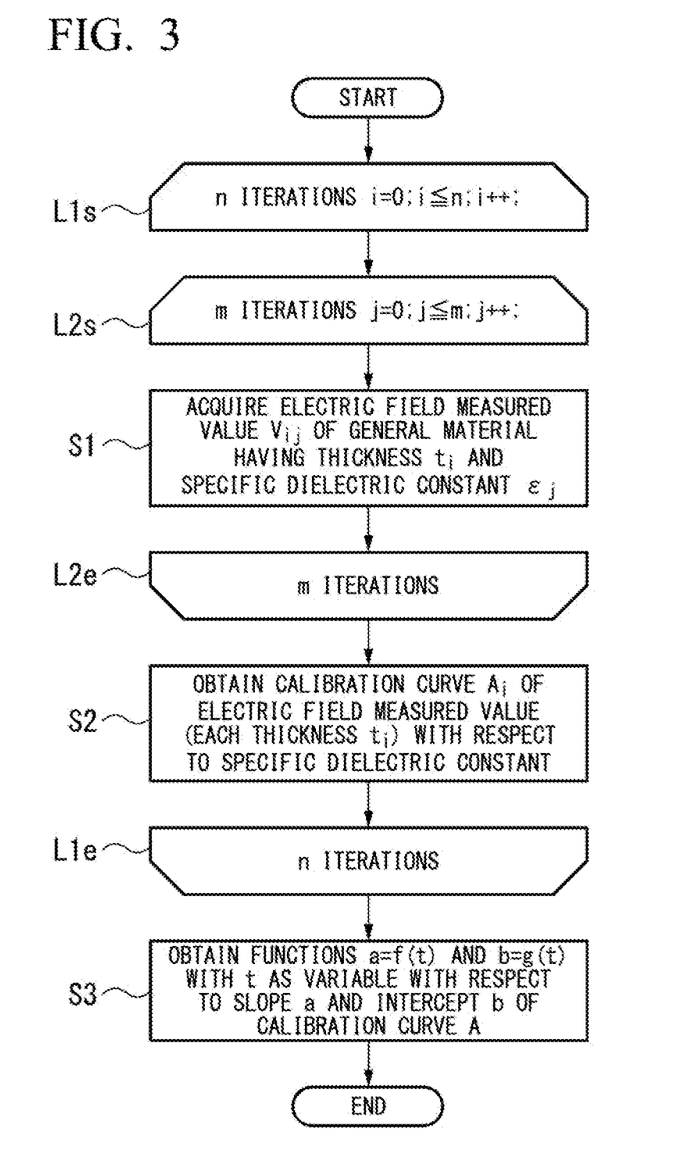
FIG. 3 is a flowchart of a calibration curve introduction procedure according to the present embodiment.

FIG. 3 is a flowchart of the procedure of introducing the calibration curve according to the present embodiment. The following process is performed using a sample whose thickness and specific dielectric constant are known before the sample 2 whose specific dielectric constant is desired to be obtained is measured. In this pre-process, sample 1 (a specific dielectric constant Ed), sample 2 (a specific dielectric constant $\varepsilon_{r2}$), ..., and sample in (a specific dielectric constant $\varepsilon_{rm}$) which have a thickness $t_1$, ..., sample 1 (a specific dielectric constant $\varepsilon_{r1}$), sample 2 (a specific dielectric constant $E_{r2}$), ..., and sample m (a specific dielectric constant $\varepsilon_{rm}$) which have a thickness $t_0$ are used. That is, the number of samples used in the pre-process is n×m. The thickness of the sample may be unknown. In this case, the measurement device 1 measures the thickness of the sample with the thickness gauge 12. Each sample may be a sheet- or film-shaped general plastic material having a stable specific dielectric constant. It is desirable that n and m are 3 or more so that an approximation process is performed.

(Loop processing L1s to L1e) The calculator 141 iterates loop processing L2s to L2e and the processing of step S2 n times. In the processing of the first iteration, the calculator 141 sets i to 0 and adds 1 to i. The calculator 141 adds 1 to i in the processing of second and subsequent iterations.

(Loop processing L2s to L2e) The calculator 141 iterates the processing of step S1 m times.

In the processing of the first iteration, the calculator 141 sets j to 0 and adds 1 to j. The calculator 141 adds 1 to j in the processing of second and subsequent iterations.

(Step S1) An operator places a sample (a general material) having a thickness of $t_i$ and a specific dielectric constant of $\varepsilon_j$ between the electric field generation source 11 (FIG. 1) and the sensor 13 (FIG. 1). The calculator 141 acquires an electric field measured value $V_{ij}$ of the sample.

(Step S2) The calculator 141 obtains a calibration curve A of the electric field measured value with respect to the specific dielectric constant according to linear approximation for each thickness $t_i$. Subsequently, the calculator 141 causes the storage 15 to store a slope a and an intercept b of the calibration curve A.

(Step S3) The calculator 141 obtains a first function $a=f(t)$ and a second function $b=f(t)$ with t as a variable with respect to the slope a and the intercept b of the calibration curve A according to approximation. Subsequently, the calculator 141 causes the storage 15 to store the first function $a=f(t)$ and the second function $b=f(t)$.

A specific example of the process shown in FIG. 3 will be described.

The measurement device 1 measures an electric field measured value $V_{11}$ of a first sample (a specific dielectric constant $\varepsilon_{r1}$) having a thickness $t_1$. Next, the measurement device 1 measures an electric field measured value $V_{12}$ of a second sample (a specific dielectric constant $\varepsilon_{r2}$) having the thickness $t_1$. Next, the measurement device 1 measures an electric field measured value $V_{13}$ of a third sample (a specific dielectric constant $\varepsilon_{r3}$) having the thickness $t_1$ (loop processing L2s to L2e of a first iteration).

Next, the calculator 141 obtains a calibration curve $A_1$ ($V=a_1 \times \varepsilon_r + b_1$) having the thickness $t_1$ by performing linear approximation according to regression analysis (step S2 of the first iteration). The calculator 141 causes the storage 15 to store a slope $a_1$ and an intercept $b_1$ of the calibration curve $A_1$.

Next, the measurement device 1 measures an electric field measured value $V_{24}$ of a fourth sample (a specific dielectric constant $\varepsilon_{r4}$) having a thickness $t_2$. Next, the measurement device 1 measures an electric field measured value $V_{25}$ of a fifth sample (a specific dielectric constant $\varepsilon_{r5}$) having the thickness $t_2$. Next, the measurement device 1 measures an electric field measured value $V_{26}$ of a sixth sample (a specific dielectric constant $\varepsilon_{r6}$) having the thickness $t_2$ (loop processing L2s to L2e of a second iteration).

Next, the calculator 141 obtains a calibration curve $A_2$ ($V=a_2\times\varepsilon_r+b_2$) having the thickness $t_2$ by performing linear approximation according to regression analysis (step S2 of the second iteration). The calculator 141 causes the storage 15 to store a slope $a_2$ and an intercept $b_2$ of the calibration curve $A_2$.

Next, the measurement device 1 measures an electric field measured value $V_{37}$ of a seventh sample (a specific dielectric constant $\varepsilon_{r7}$) having a thickness $t_3$. Next, the measurement device 1 measures an electric field measured value $V_{38}$ of an eighth sample (a specific dielectric constant $\varepsilon_{r8}$) having the thickness $t_3$. Next, the measurement device 1 measures an electric field measured value $V_{39}$ of a ninth sample (a specific dielectric constant $\varepsilon_{r9}$) having the thickness $t_3$ (loop processing L2s to L2e of a third iteration).

Next, the calculator 141 obtains a calibration curve $A_3$ ($V=a_3\times\varepsilon_r+b_3$) having the thickness $t_3$ by performing linear approximation according to regression analysis (step S2 of the third iteration). The calculator 141 causes the storage 15 to store a slope $a_3$ and an intercept $b_3$ of the calibration curve $A_3$.

Figure 4:
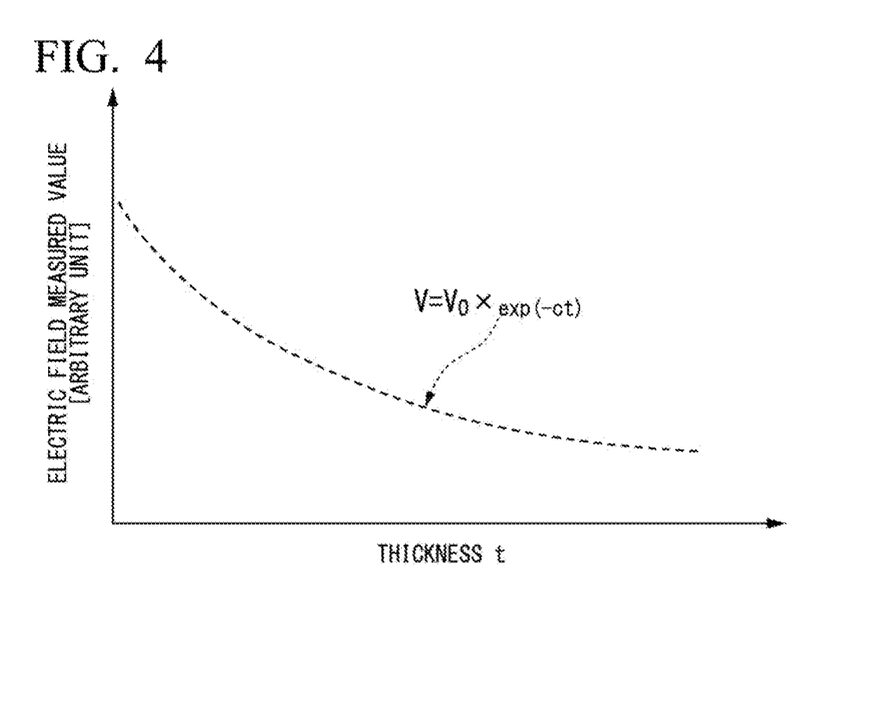
FIG. 4 is a diagram showing an example of a relationship between a thickness and an electric field measured value.

Measurement results obtained by the above-described process are as shown in FIG. 2. The example of FIG. 2 is an example in which a pre-process is performed using 21 samples. A graph when the electric field measured value V is taken on the vertical axis and the thickness t is taken on the horizontal axis is shown as FIG. 4. FIG. 4 will be described below.

Next, the calculator 141 obtains the first function $a=f(t)$ using the slope $a_1$ of the thickness $t_1$, the slope $a_2$ of the thickness $t_2$, and the slope $a_3$ of the thickness $t_3$. The calculator 141 obtains the second function $b=f(t)$ using the intercept $b_1$ of the thickness $t_1$, the intercept $b_2$ of the thickness $t_2$, and the intercept $b_3$ of the thickness $t_3$. The calculator 141 obtains a function using, for example, exponential approximation.

[Procedure of Deriving Calibration Curve]

Next, a method of obtaining the specific dielectric constant of the sample 2 will be described.

First, a relationship between a thickness and an electric field measured value will be described.

FIG. 4 is a diagram showing an example of the relationship between the thickness and the electric field measured value. In FIG. 4, the horizontal axis represents the thickness (μm) and the vertical axis represents an electric field measured value (an arbitrary unit).

When the thickness of the sample 2 located between the sensor 13 and the electric field generation source 11 becomes thick, the intensity of the AC electric field 3 detected by the sensor 13 exponentially decreases as shown in FIG. 4 because a passage loss occurs in accordance with the Lambert-Beer law. Assuming that the thickness is t, the electric field measured value is V, and the attenuation coefficient is c, the electric field measured value V can be represented by $V=V_0\times\exp(-ct)$.

That is, the electric field measured value, which is the intensity of the AC electric field 3 detected by the sensor 13, is a function of the thickness and the specific dielectric constant of the sample 2 which is a measurement target. Therefore, when either the thickness or the specific dielectric constant is desired to be obtained, the other value can be obtained from either one value thereof and the electric field measured value. Because the purpose of the present embodiment is to measure the specific dielectric constant, the thickness of the sample 2 is acquired by the thickness gauge 12 together with the electric field measured value.

Figure 5:
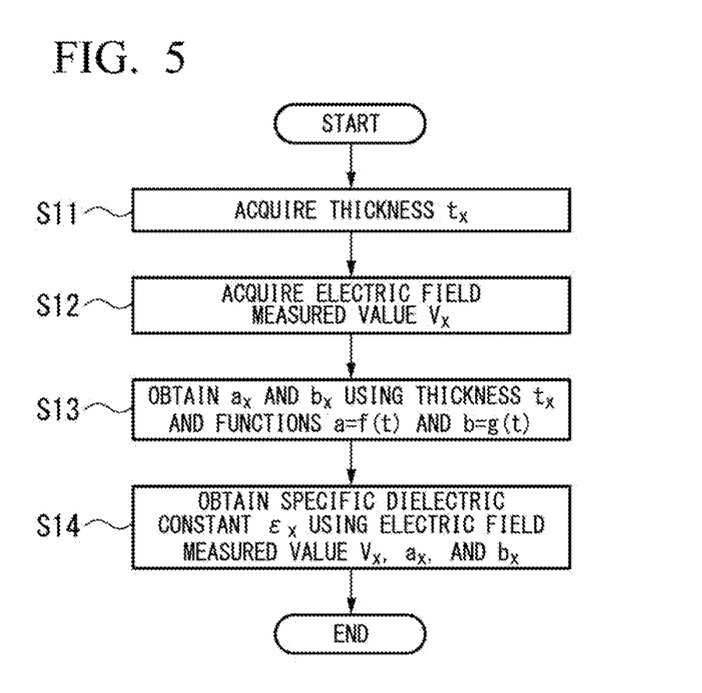
FIG. 5 is a flowchart of a procedure of measuring a specific dielectric constant according to the present embodiment.

FIG. 5 is a flowchart of a procedure of measuring the specific dielectric constant according to the present embodiment. The sample 2 whose specific dielectric constant is to be measured in FIG. 5 is a dielectric material whose specific dielectric constant and thickness are unknown. During the measurement, the operator places the sample 2 between the electric field generation source 11 (FIG. 1) and the sensor 13 (FIG. 1).

(Step S11) The calculator 141 acquires a measured value of a thickness $t_x$ of the sample 2 output from the thickness gauge 12.

(Step S12) The calculator 141 acquires an electric field measured value $V_x$ of the sample 2 output from the sensor 13.

(Step S13) The calculator 141 obtains a slope ax and an intercept $b_x$ using the acquired thickness $t_x$ and the first function $a=f(t)$ and the second function $b=f(t)$ stored in the storage 15. Thereby, the calculator 141 obtains a relational equation ($V=a_x\times\varepsilon_r+b_x$) between the specific dielectric constant $\varepsilon r$ and the electric field measured value V.

(Step S14) The calculator 141 obtains a specific dielectric constant $\varepsilon_x$ using the relational equation ($V=a_x\times\varepsilon_r+b_x$) of the electric field measured value $V_x$, the slope $a_x$, and the intercept $b_x$. That is, the calculator 141 obtains the specific dielectric constant $\varepsilon_x$ according to $(V-b_x)/a_x$.

[Electro-Optic Probe]

The outline of the electro-optic probe will be described.

Figure 6:
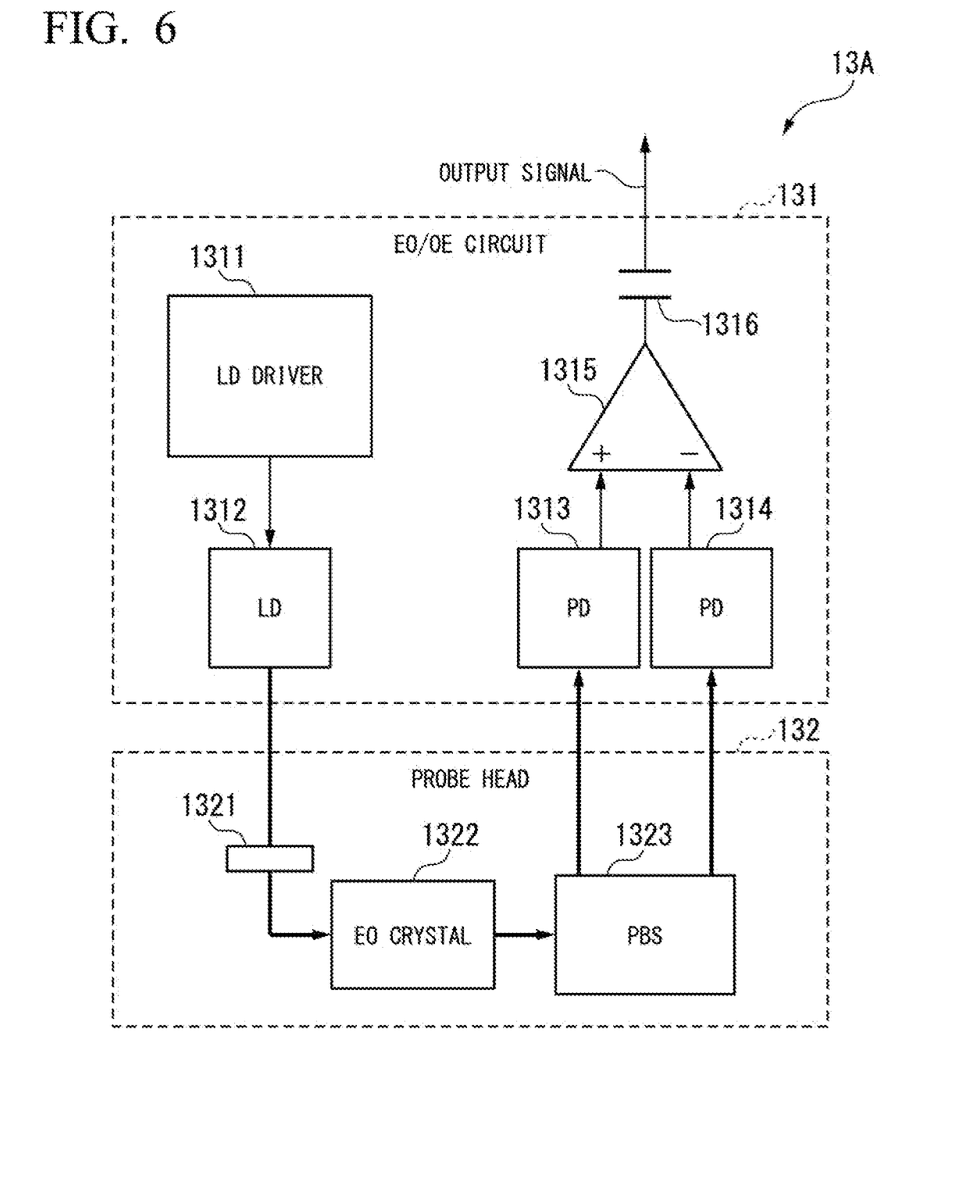
FIG. 6 is a block diagram of an example of a configuration of an electro-optic probe.

FIG. 6 is a block diagram of an example of a configuration of an electro-optic probe 13A. FIG. 6 shows an example in which the electro-optic probe 13A is applied to the sensor 13. As shown in FIG. 6, the electro-optic probe 13A includes an EO/OE circuit 131 and a probe head 132. The EO/OE circuit 131 includes an LD driver 1311, an LD 1312, a PD 1313, a PD 1314, a differential amplifier 1315, and a capacitor 1316. The probe head 132 includes a wave plate 1321, an EO crystal 1322, and a PBS 1323.

The EO/OE circuit 131 converts an electric field intensity detected by the probe head 132 into an electrical signal and outputs the electrical signal. The LD driver 1311 drives the LD 1312. The LD 1312 is, for example, a semiconductor laser. The PD 1313 and the PD 1314 are light receivers, receive P waves and S waves of laser light from the probe head 132, convert the received P and S waves into electrical signals, and output the electrical signals to the differential amplifier 1315. The differential amplifier 1315 obtains a difference between the electrical signal output by the PD 1313 and the electrical signal output by the PD 1314 and outputs an output signal obtained by amplifying an obtained intensity difference and cutting a direct current (DC) component by the capacitor 1316.

Laser light radiated by the LD 1312 of the EO/OE circuit 131 is transmitted to the probe head 132 via an optical fiber.

In the probe head 132, the laser light transmitted through the wave plate 1321 and the EO crystal 1322 is split into two linearly polarized light beams of P and S waves by the PBS 1323 (a polarizing beam splitter). The EO crystal 1322 is a crystal exhibiting an electro-optic (EO) effect in which a refractive index of the crystal changes when an electric field is applied to the crystal.

The configuration of the electro-optic probe 13A shown in FIG. 6 is an example, and the configuration is not limited thereto.

As described above, the measurement device 1 of the present embodiment can be used to implement the non-contact measurement of a specific dielectric constant, which was not possible in the conventional technology.

According to the present embodiment, an electro-optic probe for the sensor 13 that detects the electric field can be employed to perform stable measurement with low disturbance as compared with measurement using a metal antenna. In the present embodiment, it is possible to perform measurement with higher spatial resolution than measurement using the metal antenna by devising measures such as miniaturization of the electro-optic crystal for use in the electro-optic probe and reduction in a beam diameter of reference light.

Further, according to the present embodiment, a frequency of a signal input to the electric field generation source 11 is about several kHz to several MHz, so that it is possible to achieve an effect that the device can be cost-effectively constructed as compared with a measurement method using a millimeter wave band or a microwave band without the need for speeding up the signal detection circuit.

Example of In-Line Measurement During Sheet/Film Manufacturing Process

Figure 7:
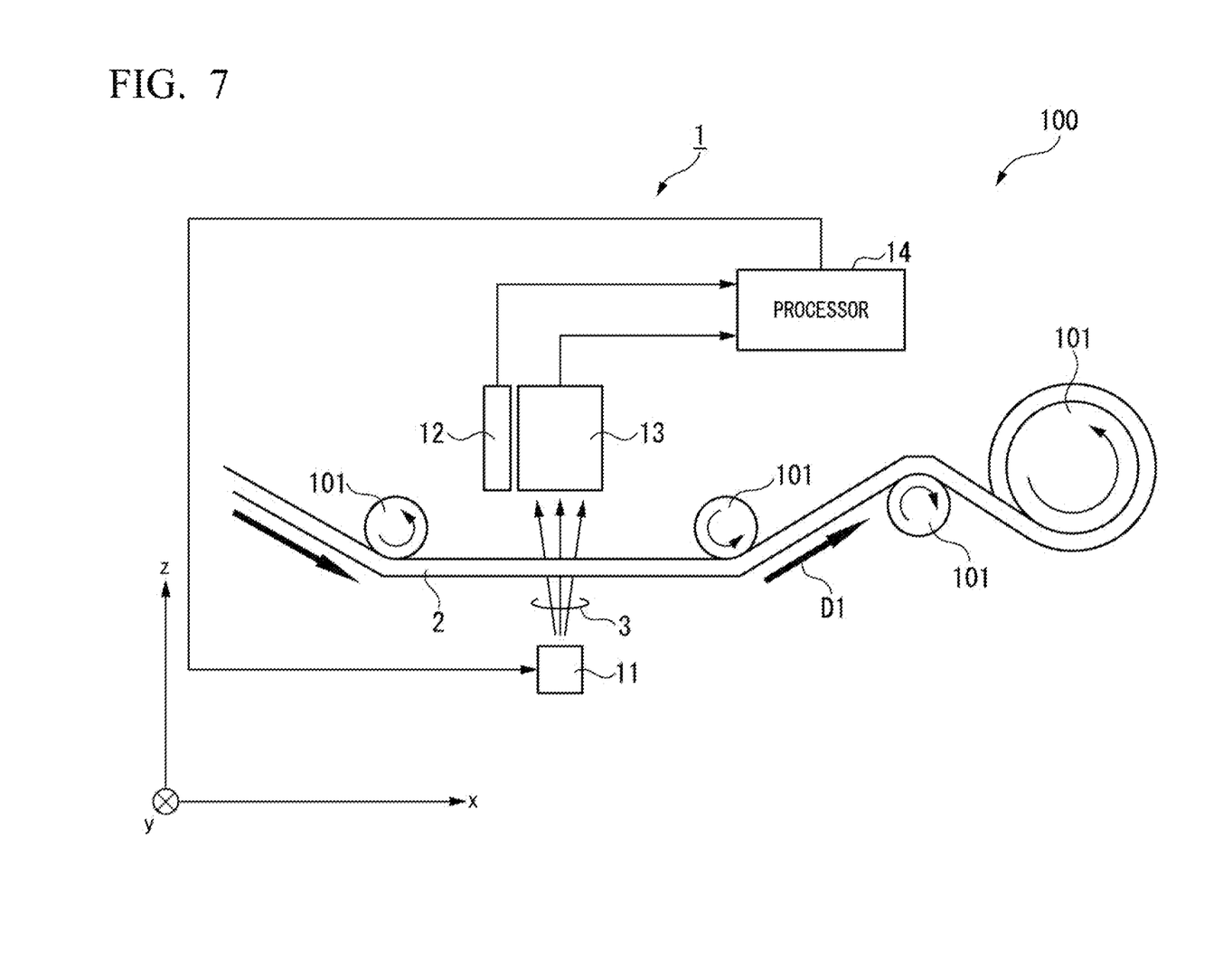
FIG. 7 is a diagram showing an example in which the measurement device of the present embodiment is applied during a process in which a sheet- or film-shaped dielectric material is conveyed and manufactured at a high speed.

Next, an example in which the measurement device 1 is applied during a process in which a sheet- or film-shaped dielectric material is conveyed and manufactured at a high speed will be described. By applying the measurement device 1 to this process, in-line measurement of the specific dielectric constant can be implemented with high spatial resolution in a non-contact manner.

FIG. 7 is a diagram showing an example in which the measurement device 1 of the present embodiment is applied to a manufacturing device 100 by which a sheet- or film-shaped dielectric material is conveyed and manufactured at a high speed. The manufacturing device 100 includes a measurement device 1 and a conveyance means 101 (a conveyance device). In the xyz Cartesian coordinate system shown in FIG. 7, the x-axis is in a direction along a conveyance direction D1 of the sample 2, the y-axis is in a direction along a width direction of the sample 2, and the z-axis is in a direction along a vertical direction.

The sample 2 is conveyed at a high speed in the x-axis direction by a conveyance means 101 such as an aluminum roll for winding and conveying the sample 2.

In FIG. 7, the farther a distance between the electric field generation source 11 and the sensor 13 is, the lower the electric field intensity detected by the sensor 13 is and the worse an S/N ratio is. In this case, S/N deterioration can be restricted by exciting the electric field generation source 11 with a high-voltage AC signal and increasing the intensity of the AC electric field 3 detected by the sensor 13. It is easy to generate a high-voltage signal in a relatively low frequency band. The relatively low frequency is, for example, about several kHz to several MHz. As described above, in the present embodiment, for example, a high-voltage signal of about several kHz to several MHz is used, so that high-precision measurement can be easily implemented even if the distance between the sensor 13 and the electric field generation source 11 is increased.

When the distance between the sample 2 and the sensor 13 or the distance between the sample 2 and the electric field generation source 11 is as short as in the conventional technology, the sample 2 is in contact with the sensor 13 and the electric field generation source 11 and hence problems such as scratches and holes on the surface of the sample 2 occur. On the other hand, according to the present embodiment, the sample 2 is conveyed in a state in which a gap having a sufficient distance is secured, so that contact does not occur and high-precision measurement can be performed as described above.

Figure 8:
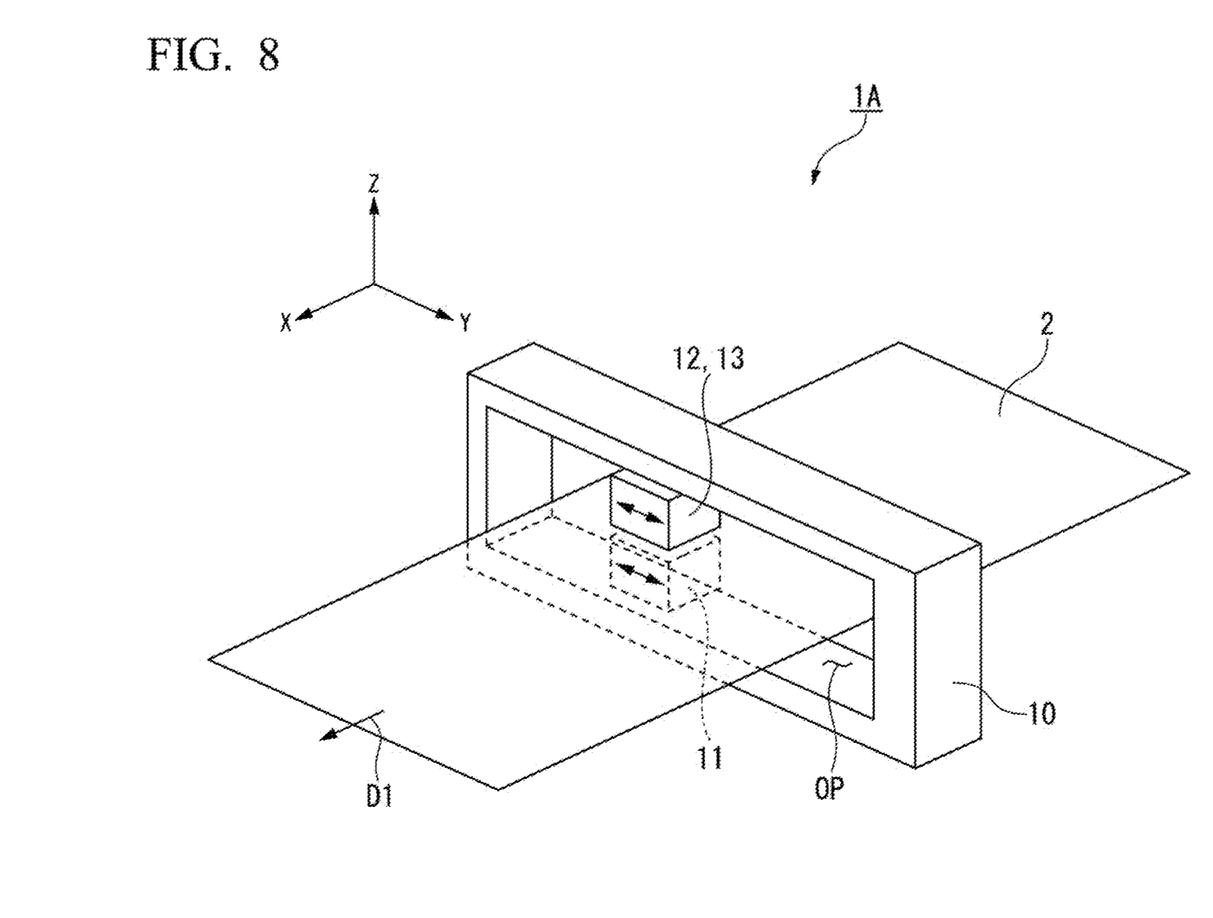
FIG. 8 is a perspective view showing a schematic configuration of the measurement device according to the present embodiment.

FIG. 8 is a perspective view showing a schematic configuration of a measurement device 1A according to the present embodiment. As shown in FIG. 8, the measurement device 1A further includes a frame 10.

The frame 10 is a substantially square ring-shaped member having a longitudinal direction and a short direction as external shapes. The frame 10 supports the thickness gauge 12, the sensor 13, and the electric field generation source 11 so that they can reciprocate in the longitudinal direction within an opening OP of the frame 10. Specifically, the frame 10 is disposed so that the longitudinal direction is in a width direction (a y-direction) of the paper P, the short direction is in a vertical direction (a z-direction), and the sample 2 passes through substantially the center of the opening OP.

That is, the frame 10 is aligned with respect to the sample 2 so that the thickness gauge 12 and the sensor 13 are disposed above the sample 2 to be conveyed and the electric field generation source 11 is disposed below the sample 2 to be conveyed. A mechanism for causing the thickness gauge 12 and the sensor 13 to reciprocate in the y-direction along the front surface of the sample 2 and a mechanism for causing the electric field generation source 11 to reciprocate in the y-direction along the back surface of the sample 2 are provided. That is, the measurement device 1A has a scanning mechanism (a movement device) in a horizontal direction orthogonal to a conveying direction of the sample 2 (a measurement target). If these mechanisms are driven in the same manner, the thickness gauge 12, the sensor 13, and the electric field generation source 11 can be reciprocated in synchronization with each other.

As described above, according to the present embodiment, it is possible to measure a specific dielectric constant of a sheet- or film-shaped dielectric with high spatial resolution in a non-contact manner.

All or part of processing to be performed by the processor 14 may be performed by recording a program for implementing all or some of the functions of the processor 14 according to the present invention on a computer-readable recording medium and causing a computer system to read and execute the program recorded on the recording medium. The "computer system" used here is assumed to include an operating system (OS) and hardware such as peripheral devices. The "computer system" is assumed to include a homepage providing environment (or displaying environment) when a World Wide Web (WWW) system is used. The "computer-readable recording medium" refers to a storage device, including a portable medium such as a flexible disk, a magneto-optical disc, a read only memory (ROM), and a compact disc (CD)-ROM, and a hard disk embedded in the computer system. Further, the "computer-readable recording medium" is assumed to include a computer-readable recording medium for retaining the program for a predetermined time period as in a volatile memory (a random access memory (RAM)) inside the computer system including a server and a client when the program is transmitted via a network such as the Internet or a communication circuit such as a telephone circuit.

The above-described program may be transmitted from a computer system storing the program in a storage device or the like via a transmission medium or by transmission waves in a transmission medium to another computer system. The "transmission medium" for transmitting the program refers to a medium having a function of transmitting information, such as a network (a communication network) like the Internet or a communication circuit (a communication line) like a telephone circuit. The above-described program may be a program for implementing some of the above-described functions. Further, the above-described program may be a program capable of implementing the above-described function in combination with a program already recorded on the computer system, i.e., a so-called differential file (differential program).

Although the configuration for carrying out the present invention have been described above using the embodiments, the present invention is not limited to the embodiments and various modifications and replacements can be applied without departing from the spirit and scope of the present invention.

REFERENCE SIGNS LIST 1, 1A Measurement device
11 Electric field generation source
12 Thickness gauge
13 Sensor
13A Electro-optic probe
14 Processor
15 Storage
16 Output
141 Calculator
142 Controller
2 Sample
10 Frame
101 Conveyance means
100 Manufacturing device

The invention claimed is:

1. A measurement device comprising:
an electric field generator configured to generate an alternating current electric field;
an electric field detector disposed to face the electric field generator at a distance from the electric field generator and configured to detect the alternating current electric field generated by the electric field generator;
a thickness gauge configured to measure a thickness of a measurement target in a non-contact manner; and
a processor configured to, using a plurality of samples whose specific dielectric constants are known, derive a plurality of calibration curves for each thickness of the plurality of samples, the plurality of calibration curves representing a relationship between a specific dielectric constant and an intensity of an alternating current electric field,
wherein the measurement target is insertable between the electric field generator and the electric field detector,
the electric field detector is configured to detect an intensity of the alternating current electric field attenuated by the measurement target, and
the processor is configured to calculate a specific dielectric constant of the measurement target based on the detected intensity of the alternating current electric field, the measured thickness of the measurement target, and a calibration curve associated with the measured thickness among the derived plurality of calibration curves,
wherein the processor is configured to obtain slopes and intercepts for each thickness of the plurality of samples from the derived plurality of calibration curves, to obtain a first function having a plurality of slopes as thickness variables, to obtain a second function having a plurality of intercepts as thickness variables, to obtain a slope and an intercept of a calibration curve associated with the measured thickness of the measurement target using the measured thickness, the first function, and the second function, and to calculate a specific dielectric constant of the measurement target using the obtained slope and the obtained intercept and the detected intensity of the alternating current electric field.

2. The measurement device according to claim 1, wherein the electric field detector is an electric field sensor to which an electro-optic effect is applied.

3. The measurement device according to claim 1,
wherein the measurement target is a sheet- or film-shaped dielectric material,
a high-voltage signal is used as an excitation signal of the alternating current electric field generated from the electric field generator and a distance between the electric field generator and the electric field detector is several millimeters, and
in a case in which the measurement target is conveyed by a conveyance device at a high speed, the electric field generator and the electric field detector are disposed not to contact with the measurement target even if the measurement target vibrates in a vertical direction.

4. The measurement device according to claim 1, further comprising a movement device configured to move the electric field generator, the electric field detector, and the thickness gauge in a horizontal direction orthogonal to a conveying direction of the measurement target,
wherein the processor is configured to measure a surface distribution of a specific dielectric constant of the measurement target.

5. The measurement device according to claim 1, further comprising a storage storing the derived plurality of calibration curves.

6. The measurement device according to claim 1, wherein the processor is configured to control a start and an end of electric field generation of the electric field generator and a magnitude of the electric field.

7. A measurement method using a measurement device comprising an electric field generator configured to generate an alternating current electric field, an electric field detector disposed to face the electric field generator at a distance from the electric field generator and configured to detect the alternating current electric field generated by the electric field generator, a thickness gauge configured to measure a thickness of a measurement target in a non-contact manner, and a processor configured to derive a calibration curve representing a relationship between a specific dielectric constant and an intensity of an alternating current electric field, wherein the measurement target is insertable between the electric field generator and the electric field detector, the measurement method comprising:
deriving, by the processor, using a plurality of samples whose specific dielectric constants are known, a plurality of calibration curves for each thickness of the plurality of samples, the plurality of calibration curves representing a relationship between the specific dielectric constant and the intensity of the alternating current electric field;
detecting, by the electric field detector, an intensity of the alternating current electric field attenuated by the measurement target whose specific dielectric constant is unknown;
measuring, by the thickness gauge, the thickness of the measurement target; and calculating, by the processor, a specific dielectric constant of the measurement target based on the detected intensity of the alternating current electric field, the measured thickness of the measurement target, and a calibration curve associated with the measured thickness among the derived plurality of calibration curves, wherein calculating the specific dielectric constant of the measurement target comprises:

obtaining, by the processor, slopes and intercepts for each thickness of the plurality of samples from the derived plurality of calibration curves;

obtaining, by the processor, a first function having a plurality of slopes as thickness variables;

obtaining, by the processor, a second function having a plurality of intercepts as thickness variables;

obtaining, by the processor, a slope and an intercept of a calibration curve associated with the measured thickness using the measured thickness, the first function, and the second function; and calculating, by the processor, the specific dielectric constant of the measurement target using the slope and the intercept and the detected intensity of the alternating current electric field.

\* \* \* \* \*